United States Patent
de Rooij et al.

(10) Patent No.: US 10,230,341 B2
(45) Date of Patent: Mar. 12, 2019

(54) HIGH EFFICIENCY VOLTAGE MODE CLASS D TOPOLOGY

(71) Applicant: Efficient Power Conversion Corporation, El Segundo, CA (US)

(72) Inventors: Michael A. de Rooij, Playa Vista, CA (US); Johan T. Strydom, Santa Clara, CA (US); Bhaskaran R. Nair, Plano, TX (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/864,814

(22) Filed: Jan. 8, 2018

(65) Prior Publication Data

US 2018/0131335 A1 May 10, 2018

Related U.S. Application Data

(62) Division of application No. 14/481,402, filed on Sep. 9, 2014, now Pat. No. 9,887,677.

(60) Provisional application No. 61/876,056, filed on Sep. 10, 2013, provisional application No. 61/968,730, filed on Mar. 21, 2014.

(51) Int. Cl.
*H03F 1/56* (2006.01)
*H03F 3/217* (2006.01)
*H02J 50/12* (2016.01)

(52) U.S. Cl.
CPC ............ *H03F 3/2171* (2013.01); *H02J 50/12* (2016.02); *H03F 1/565* (2013.01); *H03F 3/2173* (2013.01); *H03F 2200/387* (2013.01); *H03F 2200/541* (2013.01)

(58) Field of Classification Search
None
See application file for complete search history.

(56) References Cited

U.S. PATENT DOCUMENTS 5,872,489 A    2/1999 Chang et al.
6,548,985 B1   4/2003 Hayes
(Continued)

FOREIGN PATENT DOCUMENTS

WO    WO 2009/147379 A1   12/2009
WO    WO 2013/014521 A1    1/2013

OTHER PUBLICATIONS

Class-D Power Amplifier, Electrical Engineering Department—California Polytechnic State University, 2010, Authors: Moldonado, Joseph and Vega, Jeovany.*

(Continued)

*Primary Examiner* — Jared Fureman
*Assistant Examiner* — Joel Barnett
(74) *Attorney, Agent, or Firm* — Blank Rome LLP

(57) ABSTRACT

A high efficiency voltage mode class D amplifier and energy transfer system is provided. The amplifier and system includes a pair of transistors connected in series between a voltage source and a ground connection. Further, a ramp current tank circuit is coupled in parallel with one of the pair of transistors and a resonant tuned load circuit is coupled to the ramp current tank circuit. The ramp current tank circuit can include an inductor that absorbs an output capacitance $C_{OSS}$ of the pair of transistors and a capacitor the provides DC blocking.

7 Claims, 7 Drawing Sheets

(56) References Cited

U.S. PATENT DOCUMENTS

| | | | |
|---|---|---|---|
| 7,706,154 B2* | 4/2010 | Chen | H02M 3/3374 363/17 |
| 8,378,723 B1* | 2/2013 | Atesoglu | H03L 7/099 327/148 |
| 2006/0181363 A1 | 8/2006 | Eo et al. | |
| 2007/0007621 A1 | 1/2007 | Omura et al. | |
| 2008/0297248 A1* | 12/2008 | Honda | H03F 3/2173 330/251 |
| 2009/0122909 A1 | 5/2009 | Pivit | |
| 2009/0167466 A1* | 7/2009 | Qiu | H01F 17/0006 334/40 |
| 2010/0184371 A1 | 7/2010 | Cook | |
| 2010/0239102 A1* | 9/2010 | Miao | H03F 1/26 381/73.1 |
| 2011/0234331 A1* | 9/2011 | Ding | H03B 5/1212 331/36 C |
| 2012/0032236 A1 | 2/2012 | Yamazaki et al. | |
| 2012/0112257 A1 | 5/2012 | Kato | |
| 2012/0262953 A1 | 10/2012 | Jungreis | |
| 2012/0286868 A1 | 11/2012 | Haroun | |
| 2013/0082538 A1 | 4/2013 | Wambsganss et al. | |
| 2013/0088088 A1 | 4/2013 | Wambsganss et al. | |
| 2013/0175524 A1 | 7/2013 | Yamazaki et al. | |
| 2013/0210376 A1 | 8/2013 | Hur et al. | |

OTHER PUBLICATIONS

S. Lin et al., "Development of a Wideband Highly Efficient GaN VMCD VHF/UHF Power Amplifier," Progress in Electromagnetics Research C, vol. 19, pp. 135-147, 2011.

S-A, El-Hamamsy et al., "Design of High-Efficiency RF Class-D Power Amplifier." IEEE Transactions on Power Electronics, vol. 9, No. 3, pp. 297-308, May 1994.

H. Kobayashi et al., "Current-Mode Class-D Power Amplifiers for High-Efficiency RF Applications." IEEE Transactions on Microwave Theory and Techniques, vol. 49, No. 12, pp. 2480-2485, Dec. 2001.

\* cited by examiner

//HIGH EFFICIENCY VOLTAGE MODE CLASS D TOPOLOGY

PRIORITY

This application is a divisional of U.S. patent application Ser. No. 14/481,402, filed Sep. 9, 2014, which claims the benefit of U.S. Provisional Application No. 61/876,056, filed on Sep. 10, 2013 and U.S. Provisional Application No. 61/968,730, filed on Mar. 21, 2014, the contents of each of which are hereby incorporated by reference.

BACKGROUND OF THE INVENTION

1. Field of the Invention

The present invention relates generally to voltage mode class D topologies and, more particularly, to high efficiency voltage mode class D amplifiers and wireless energy transfer systems.

2. Description of the Related Art

Recently, there have been many developments in wireless power transmission systems (also referred to as an "energy transfer systems") using highly resonant electromagnetic induction. In general, such systems include a power source and transmitting coil as well as a receiving coil connected to the device to be power (i.e., the load). The architecture for wireless power transmission systems is centered on the use of coils to generate a high frequency alternating magnetic field that is used to transfer energy from the source to the device. The power source will deliver energy in the form of voltage and current to the transmitting coil that will create a magnetic field around the coil that changes as the applied voltage and current changes. Electromagnetic waves will travel from the coil, through free space to a receiving coil coupled to the load. As the electromagnetic waves pass by and sweep the receiving coil, a current is induced in the receiving coil that is proportional to the energy that the antenna captures.

When the source and load are coupled during wireless power transmission, the resulting configuration effectively forms a transformer with a low coupling coefficient. This resulting transformer has a leakage inductance that can be significantly larger than the magnetizing inductance. An analysis of the transformer model under these conditions reveals that the primary side leakage inductance almost solely determines the efficiency of energy transfer. To overcome the leakage inductance, some systems use resonance to increase the voltage across the leakage inductance and hence the magnetizing inductance with resulting increase in power delivery.

One conventional wireless energy transfer topology uses a traditional voltage mode class D ("VMCD") amplifier in wireless energy transfer system. FIG. 1 illustrates a circuit diagram for a VMCD amplifier. As shown, the VMCD amplifier 100 includes a power amplifier 110 and load 120. The power amplifier 110 includes two transistors 111 and 112 that are coupled in series between a voltage source $V_{DD}$ and ground. The two transistors 111 and 112 are driven 180° out of phase to form a half bridge topology. Conventionally, the transistors 111 and 112 can be enhancement mode, n-channel MOSFETs, for example. Furthermore, power amplifier 110 includes a first capacitor 113 and inductor 114 that are coupled in series with load 120 to form a resonant tuning circuit. In this conventional design, the power amplifier 110 tunes the load to have a resonance at the same frequency as operation of the amplifier 110. Despite zero current switching ("ZCS"), the power amplifier 110 still experiences high losses due to the output capacitance $C_{OSS}$ of the transistors 111 and 112 each time a voltage transition occurs. As the frequency increases, the losses also increase proportionally.

To overcome these problems, existing circuits have added a matching network to the load 120 to make the load 120 appear inductive to the power amplifier 110. For example, FIG. 2 illustrates a modified circuit of VMCD amplifier 100 illustrated in FIG. 1, but includes a matching network. As shown, VMCD system 200 includes transistors 211 and 212 and further includes inductor 213 and a first capacitor 214 coupled in parallel with transistor 212. Furthermore, a second capacitor 215 is connected in series with load 220 to form a load resonant circuit 210. Due to high switching frequency and device output capacitance $C_{OSS}$, the load resonant circuit configuration (i.e., load 220 and second capacitor 215) must be tuned to be inductive at operating frequency, and, therefore, allow zero voltage switching (ZVS) and corresponding reduction in output capacitance $C_{OSS}$ losses. In design, this tuning can lead to operation of the power amplifier 110 above resonance with decrease in coil transmission efficiency. Although the amplifier will operate with reduced losses (i.e., require less cooling), the improved amplifier efficiency does not offset the reduced coil transmission efficiency.

The matching circuit (inductor 213 and capacitor 214) functions to increase the voltage to the load resonant circuit (capacitor 215 and load 220), which can be advantageous when limits are placed on the input voltage magnitude, given that the average voltage at the output of the amplifier (switch-node) is half the supply voltage $V_{DD}$. However, the matching inductor will carry the full current of the load and thus will have significant losses. Furthermore, the circuit is sensitive to load resistance variation as the matching network becomes an integral part of the tuned resonant circuit, which can shift the ideal operating inductance point to maintain proper ZVS.

Accordingly, a high efficiency VMCD amplifier and energy transfer system is desired that is preferably low profile for both the source and device units, easy to use, highly robust to changes in operating conditions, and does not require forced air cooling or a heat sink.

SUMMARY OF THE INVENTION

The present invention provides for a high efficiency VMCD power amplifier that includes a pair of transistors connected in series between a voltage source and a ground connection. Further, a ramp current tank circuit is provided in parallel with one of the pair of transistors. The tank circuit can include an inductor and capacitor connected in series and is provided to collectively absorb an output capacitance $C_{OSS}$ of each of the pair of transistors. Preferably, the L-C network of the tank circuit is designed with a very low resonant frequency, such that the converter operates as a no load buck converter. The L-C network only encounters ripple current, but does not incur losses relating to the load. As a result, inductor sizes can remain small and losses minimized. In one refinement of the invention, the high efficiency VMCD power amplifier includes a plurality of ramp current tank circuits coupled in parallel that enable discrete programmability of the ZVS current (i.e., a "ZVS VMCD power amplifier"). The VMCD power amplifier can be implemented in a wireless energy transfer system.

BRIEF DESCRIPTION OF THE DRAWINGS

The features, objects, and advantages of the present disclosure will become more apparent from the detailed description set forth below when taken in conjunction with the drawings in which like reference characters identify correspondingly elements and in which.

DETAILED DESCRIPTION OF THE PREFERRED EMBODIMENT

In the following detailed description, reference is made to certain embodiments. These embodiments are described with sufficient detail to enable those skilled in the art to practice them. It is to be understood that other embodiments may be employed and that various structural, logical, and electrical changes may be made. Moreover, while specific embodiments are described in connection with energy transfer systems, it should be understood that features described herein are generally applicable to other types of circuits, such as RF amplifiers and the like.

Figure 1:
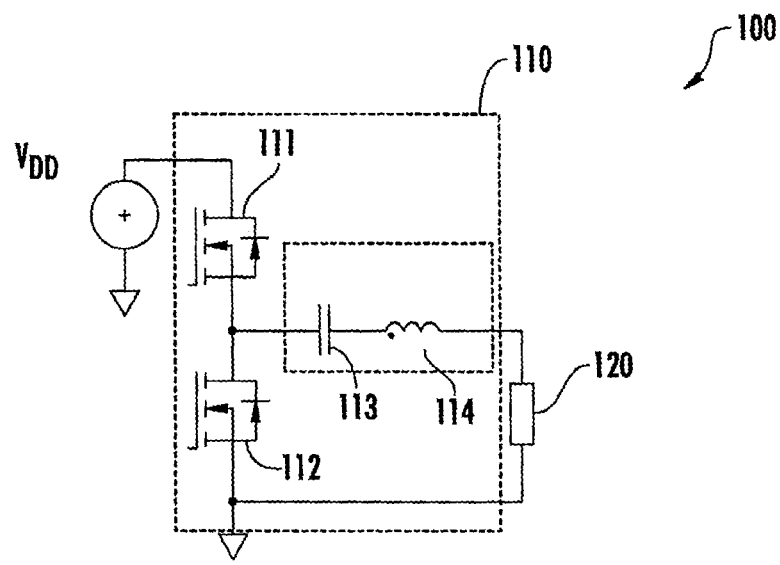
FIG. 1 illustrates a circuit diagram for a conventional voltage mode class D amplifier.
Figure 2:
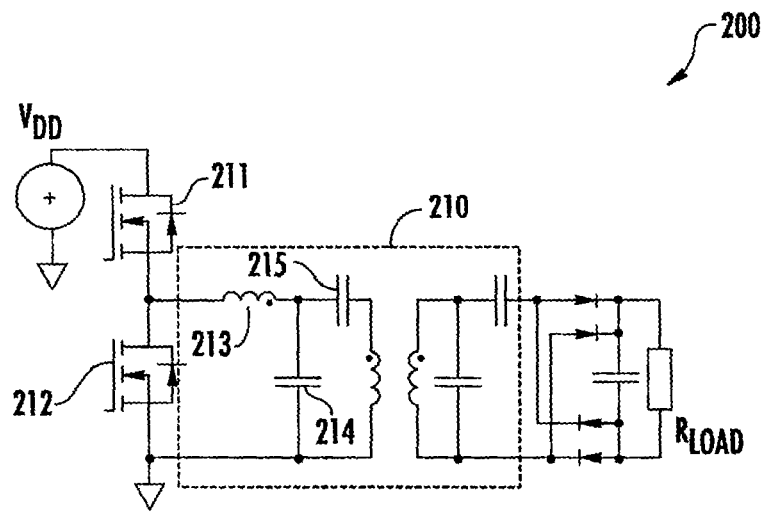
FIG. 2 illustrates a conventional VMCD amplifier implemented with a matching network.
Figure 3:
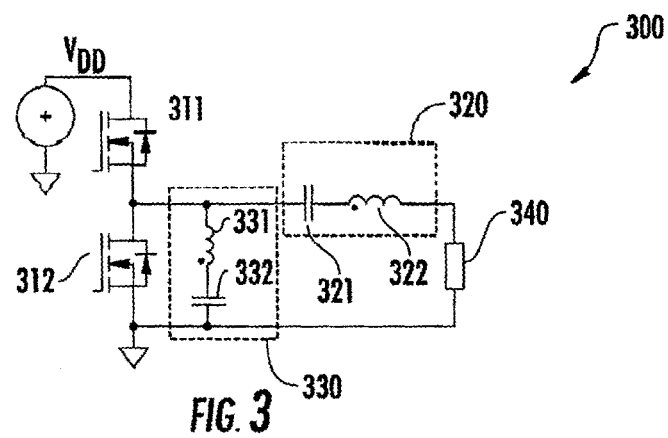
FIG. 3 illustrates a high efficiency VMCD amplifier according to an embodiment of the present invention.

FIG. 3 illustrates a high efficiency VMCD amplifier according to a first embodiment of the present invention. As shown, VMCD amplifier 300 includes two transistors 311 and 312 coupled in series between a voltage source $V_{DD}$ and ground, forming a half bridge topology. In the exemplary embodiment, transistors 311 and 312 are enhancement mode, n-channel MOSFETs. However, it should be understood that the invention is not so limited. As will be described in more detail below, VMCD amplifier 300 preferably uses GaN FETs in an alternative embodiment. Although not shown, it should be appreciated that a control circuit, such as an oscillator, is coupled to the gates of transistors 311 and 312 to alternatively turn on the first transistor 311 and the second transistor 312.

As further shown, VMCD amplifier 300 includes a resonant tuning circuit 320 formed from capacitor 321 and inductor 322, which are coupled in series between the switch node (i.e., the node between the source of transistor 311 and drain of transistor 312) and the load 340. VMCD amplifier 300 also includes a ramp current tank circuit 330 coupled between the switch node and ground, i.e., coupled in parallel to transistor 312. The ramp current tank circuit includes inductor 331 and capacitor 332, which are provided to collectively absorb the output capacitances $C_{OSS}$ of the transistors 311 and 312 by providing a current that will allow the circuit to self-commutate the switch-node with the necessary dead-time between the gate signals applied to transistors 311 and 312. Preferably, the L-C network of the tank circuit is designed with a very low resonant frequency, enabling the converter to effectively operate as a no load buck converter. The L-C network only encounters ripple current, but does not incur losses relating to the load, as experienced by conventional systems. As a result, inductor sizes can remain small and losses minimized. By keeping losses to a minimum, the L-C network functions to ensure zero voltage switching ("ZVS") operation of the amplifier, which can advantageously be used to support the operation of capacitively tuned load coils, and, more importantly, coils with wide load ranges that can alternate between an inductive load and a capacitive load. Furthermore, in the exemplary embodiment, VMCD amplifier 300 is preferably designed with the load resonance tuned to the operating frequency to further improve efficiency of energy transfer.

Figure 4:
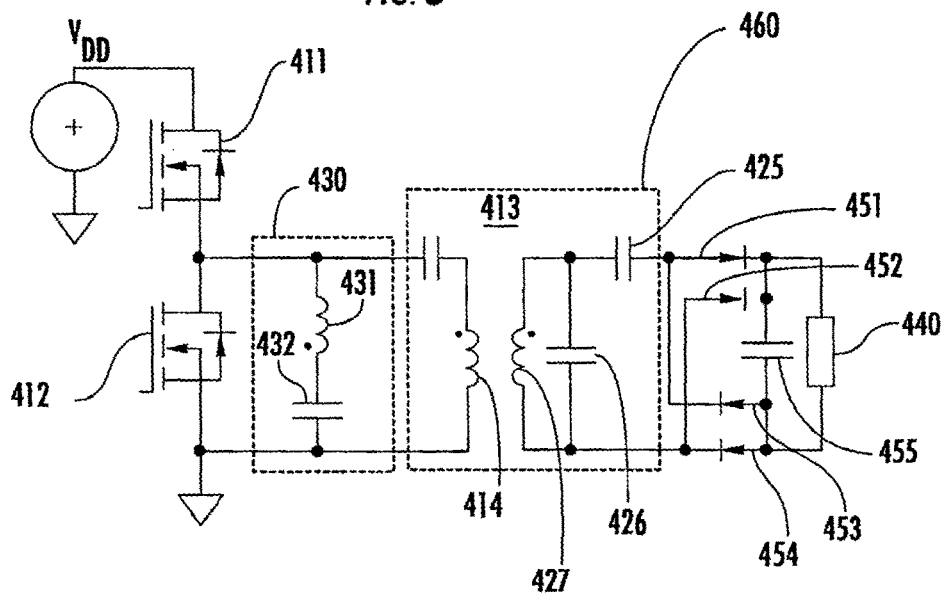
FIG. 4 illustrates a high efficiency wireless power VMCD system according to an embodiment of the present invention.

FIG. 4 illustrates an exemplary embodiment of a high efficiency wireless power VMCD system that includes a power transmitting device and a power receiving device. As shown, FIG. 4 illustrates an energy transfer system in which the power transmitting device includes VMCD amplifier 300 illustrated in FIG. 3. Namely, the power transmitting device includes transistors 411 and 412 coupled in series between a voltage source $V_{DD}$ and ground. Further, the power transmitting device comprises a ramp current tank circuit 430, which includes inductor 431 and capacitor 432, coupled between the switch node and ground. Capacitor 413 is connected in series with coil 414 to collectively form the power transmitting device 401. Although not shown, it should be appreciated that a control circuit, such as a dead-time control module, is coupled to the gates of transistors 411 and 412 to alternatively turn on the first transistor 411 and the second transistor 412.

When the power receiving device, including load 440, is inductively coupled to the power transmitting device, a highly resonant wireless energy transfer coil with matching network 460 is formed between the two devices. The power receiving device includes diodes 451, 452, 453 and 454 and a capacitor 455 coupled between diodes 452 and 453, which collectively function as a rectifier as would be understood to one skilled in the art. Furthermore, the power receiving device includes capacitors 425, 426 and coil 427 that collectively from the matching and resonant tuning network with capacitor 413 and coil 414 of the power transmitting device. Preferably, the inductances of inductor 431 is selected with a small value designed of offset the device capacitance $C_{OSS}$. Furthermore, the capacitor value of capacitor 432 can be selected for dynamic load requirements if needed.

Figure 5A:
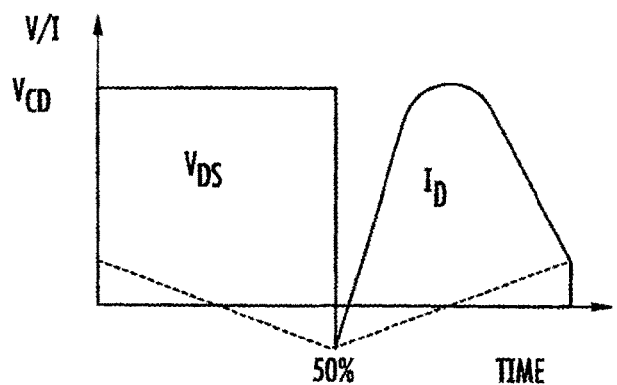
FIG. 5A illustrates a theoretical waveform for the switching devices of the energy transfer system illustrated in FIG. 4.
Figure 5B:
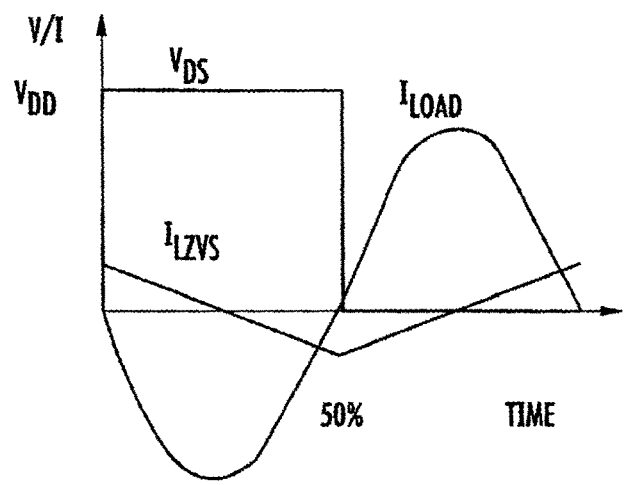
FIG. 5B illustrates a theoretical waveform of the tank circuit components of the energy transfer system illustrated in FIG. 4.

FIG. 5A illustrates a theoretical waveform for each of the switching devices (i.e., transistors 411 and 412) of the energy transfer system 400 illustrated in FIG. 4. As shown, the drain source voltage $V_{DS}$ is directly related to the square wave signal of the voltage source $V_{DD}$ and the drain current $I_D$ of the device is a function of drain source voltage $V_{DS}$. FIG. 5B illustrates a theoretical waveform of the components inductor 431 and capacitor 432 of the tank circuit 430. Again, the drain source voltage $V_{DS}$ is shown to be equal to the square wave signal of the voltage source $V_{DD}$. Further, current $I_{LZVS}$ through inductor 431 and current $I_{Load}$ through load 440 are dependent on drain source voltage $V_{DS}$ of the device. As should be appreciated, load variations will have only a minimal impact on the tank circuit as long as the deviations in the load current remain below the peak current in inductor 431. Accordingly, the energy transfer system 400 ensures proper switching for the devices and maintains low losses for the devices. As such, the only other factor that can influence the operation of the energy transfer system 400 is the supply voltage $V_{DD}$ since the current in inductor 431 is supply dependent.

As described above and shown in FIGS. 3 and 4, VMCD amplifier 300 and energy transfer system 400 comprises transistors 311, 312 and 411, 412, respectively, which are enhancement mode, n-channel MOSFETs in the exemplary embodiment. Preferably, transistors 311, 312 and/or 411, 412 are GaN FETs, such as EPC2007 devices manufactured by Efficient Power Conversion Corporation.

An experimental comparison between two exemplary energy transmission systems, one with enhancement mode, n-channel MOSFETs and one with GaN FETs, reveals that GaN transistors will have a larger impact on converter efficiency at lower output power levels and will be described as follows.

First, referring back to FIG. 4 for example, the wireless energy transfer system 400 can be provided with GaN transistors as transistors 411 and 412. Moreover, inductor 431 can be provided with a value of 300 nH and capacitor 432 can be provided with a value of 1 μF with corresponding dead-time ($V_{TH}$ to $V_{TH}$) of 3.2 ns at 36 V input. Moreover, in this exemplary embodiment, the coil set can be tuned to resonance with $C_s$ at the operating frequency. Experimental and analytical results of this configuration will be described as follows.

Figure 6:
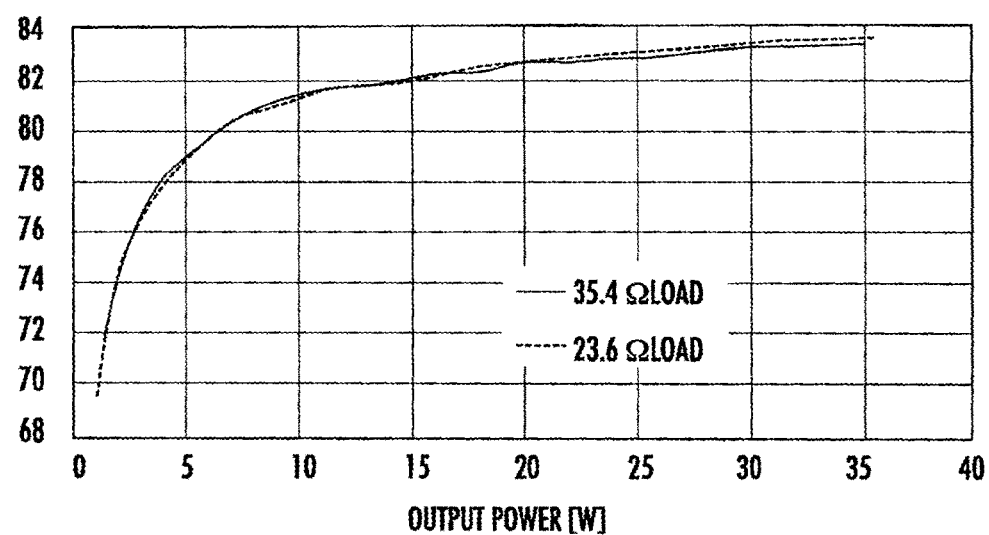
FIG. 6 illustrates a measured system efficiency of the energy transfer system illustrated in FIG. 4 with eGaN FETs.

FIG. 6 illustrates the measured system efficiency (input supply to output load) for the comparative example, including gate power for a 35.4Ω load and 23.6Ω load. As shown, the system efficiency peaks at 83.7% with 36.1 W load power for the 23.6Ω case.

Figure 7:
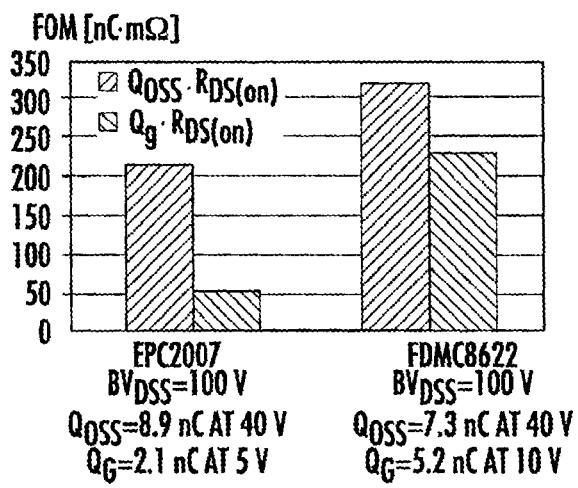
FIG. 7 illustrates a simulation of a Figure of Merit comparison between exemplary embodiment of the energy transfer system illustrated in FIG. 4.

FIG. 7 illustrates a simulation of a Figure of Merit ("FOM") comparison between the exemplary embodiment having GaN transistors and an exemplary energy transfer system using MOSFETs. In this experimental comparative analysis, FDMC8622 n-channel MOSFETs manufactured by Fairchild Semiconductor® are selected since these devices have a similar $Q_{OSS}$ value and the same voltage rating as the EPC2007 GaN transistors.

Generally speaking, it should be appreciated that ZVS voltage mode class D topology is considered a class of soft switching converter. Accordingly, FIG. 7 illustrates a comparison of the soft switching FOM between the devices each used in the configuration of the exemplary energy transfer system 400 illustrated in FIG. 4. As shown in FIG. 7, there is no appreciable difference in system efficiency between the GaN FET design and the MOSFET design. This results from the way in which the capacitor output $C_{OSS}$ is absorbed and the tradeoff between $R_{DS(on)}$ and the timing and magnitude of the tank circuit impact on device losses.

Figure 8:
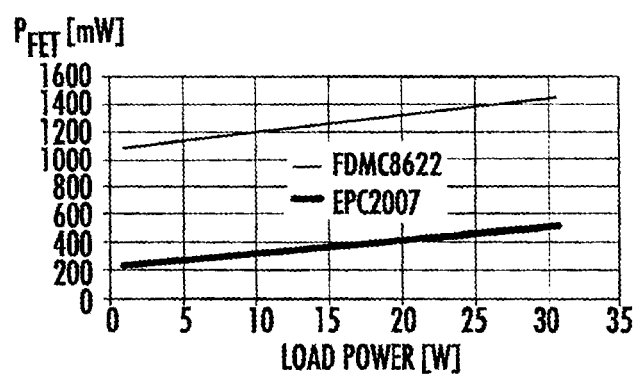
FIG. 8 illustrates a simulated comparison between total FET power for the VMCD comparison between the GaN transistors and MOSFETs.

However, FIG. 8 illustrates a comparison between total FET power (includes gate power) for the VMCD comparison between the GaN transistors and MOSFETs. As shown, the difference between the GaN transistors and MOSFETs is based on gate power consumption and reveals that GaN transistors have a larger impact on converter efficiency at lower output power levels. The total device power difference is near constant at around 900 mW over the entire load power range.

Figure 9A:
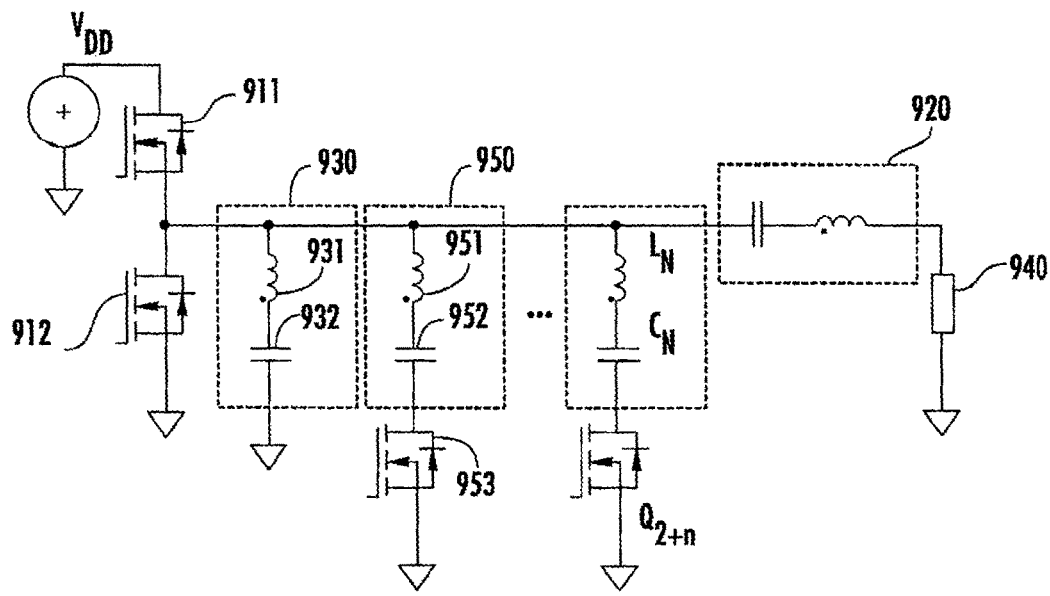
FIGS. 9A-C illustrate alternative embodiment of a high efficiency VMCD amplifier according to an exemplary embodiment of the present invention.
Figure 9B:
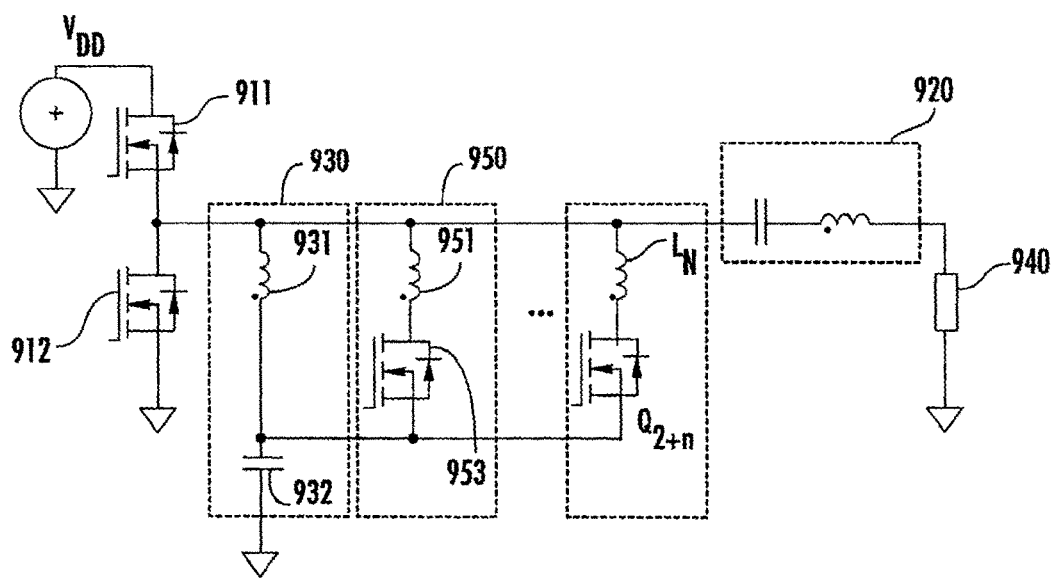
Figure 9C:
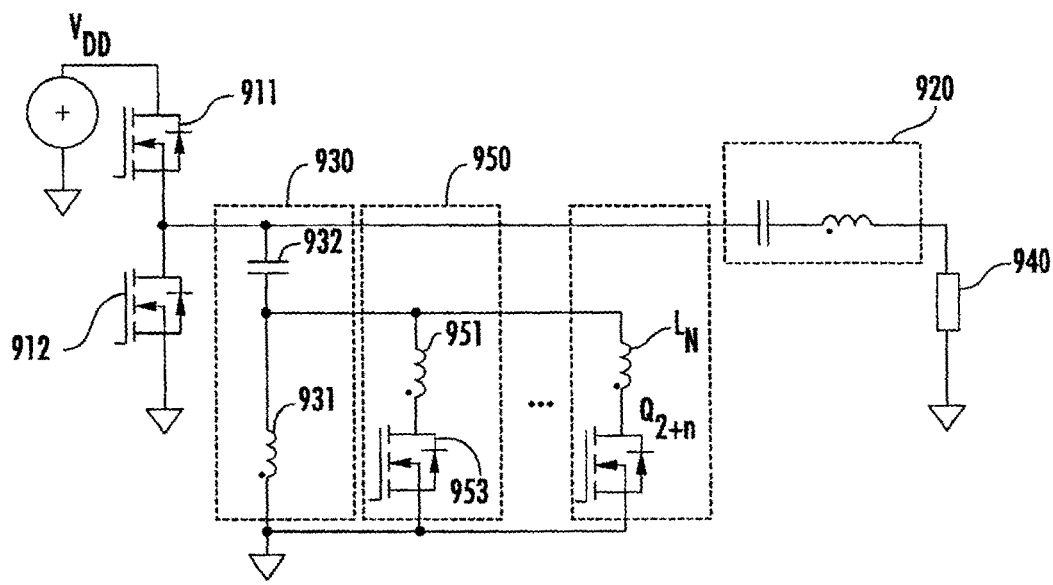

FIGS. 9A-C illustrate alternative embodiments of a high efficiency VMCD amplifier according to the present invention. In particular, the VMCD amplifiers illustrated in FIGS. 9A-C comprise similar components as VMCD amplifier 300 illustrated in FIG. 3, except in these embodiments, the VMCD amplifier includes additional tank circuits, enabling discrete programmability of the ZVS current (i.e., "ZVS VMCD power amplifiers").

As shown in FIG. 9A, two transistors 911 and 912, preferably GaN FETs, are provided that are coupled in series between a voltage source $V_{DD}$ and ground. Further, the VMCD amplifier includes a resonant tuning circuit 920 formed from capacitor 921 and inductor 922, which are coupled in series between the switch node and the load 940. The exemplary VMCD amplifier also includes a primary tank circuit 930 coupled between the switch node and ground, i.e., coupled in parallel to transistor 912. The ramp current tank circuit includes inductor 931 and capacitor 932. It should be appreciated that these components have the same configuration as VMCD amplifier 300 illustrated in FIG. 3. Although not shown, it should be appreciated that a control circuit, such as a dead-time control module, is coupled to the gates of transistors 911 and 912 to alternatively turn on the first transistor 911 and the second transistor 912.

Furthermore, the VMCD amplifier illustrated in FIG. 9A includes one or more secondary tanks circuits 950 . . . n coupled in parallel to the primary tank circuit 930. As shown, a first add-on ZVS tank circuit 950 that includes inductor 951 and capacitor 952 is connected in parallel to the primary tank circuit. An additional transistor 953 is connected in series between capacitor 952 and ground. It is contemplated that the VMCD amplifier can include n add-on ZVS tank circuits, with the nth tank circuit in FIG. 9A illustrated to include inductor $L_n$ and capacitor $C_n$ and transistor $Q_{n+2}$. It should be appreciated that this configuration of the primary tank circuit 930 in parallel with n add-on ZVS tank circuits collectively absorb the output capacitances $C_{OSS}$ of each transistor in the circuit, including transistors 911, 912, 953, $Q_{n+2}$ and so forth.

FIG. 9B illustrates a modification of the high efficiency VMCD amplifier shown in FIG. 9A. As shown in FIG. 9B, the high efficiency VMCD amplifier includes many of the same components as the design of FIG. 9A, including transistors 911 and 912, resonant tuning circuit 920, and primary tank circuit 930 coupled between the switch node and ground and including inductor 931 and capacitor 932. As further shown, each secondary tank circuit is coupled in parallel to inductor 931 of primary tank circuit 930. Moreover, capacitor 952 (shown in FIG. 9A) is replaced with transistor 953. Again, it is contemplated that the VMCD amplifier of FIG. 9B can include n add-on ZVS tank circuits, with the nth tank circuit in FIG. 9B illustrated to include inductor $L_n$ and transistor $Q_{n+2}$. Each of the n add-on ZVS tank circuits is coupled in parallel to inductor 931 of the primary tank circuit 930.

FIG. 9C illustrates a modification of the high efficiency VMCD amplifier shown in FIG. 9B. In this embodiment, the components are the same as that in FIG. 9B except that the connection of inductor 931 and capacitor 932 of the primary tank circuit 930 is reversed. In other words, capacitor 932 is coupled to the switch node between transistors 911 and 912 and inductor 931 is coupled in series between capacitor 932 and ground. Similar to the embodiment illustrated in FIG. 9B, each secondary tank circuit is coupled in parallel to inductor 931 of primary tank circuit 930. It is again contemplated that the VMCD amplifier of FIG. 9C can include n add-on ZVS tank circuits, with the nth tank circuit in FIG. 9B illustrated to include inductor $L_n$ and transistor $Q_{n+2}$. Each of the n add-on ZVS tank circuits is coupled in parallel to inductor 931 of the primary tank circuit 930.

Also, it should be understood to one skilled in the art that the VMCD amplifier illustrated in FIGS. 9A-C can be implemented in a high efficiency wireless power VMCD system with a similar design configuration that VMCD amplifier 300 of FIG. 3 is utilized in the energy transfer system 400 of FIG. 4.

Figure 10:
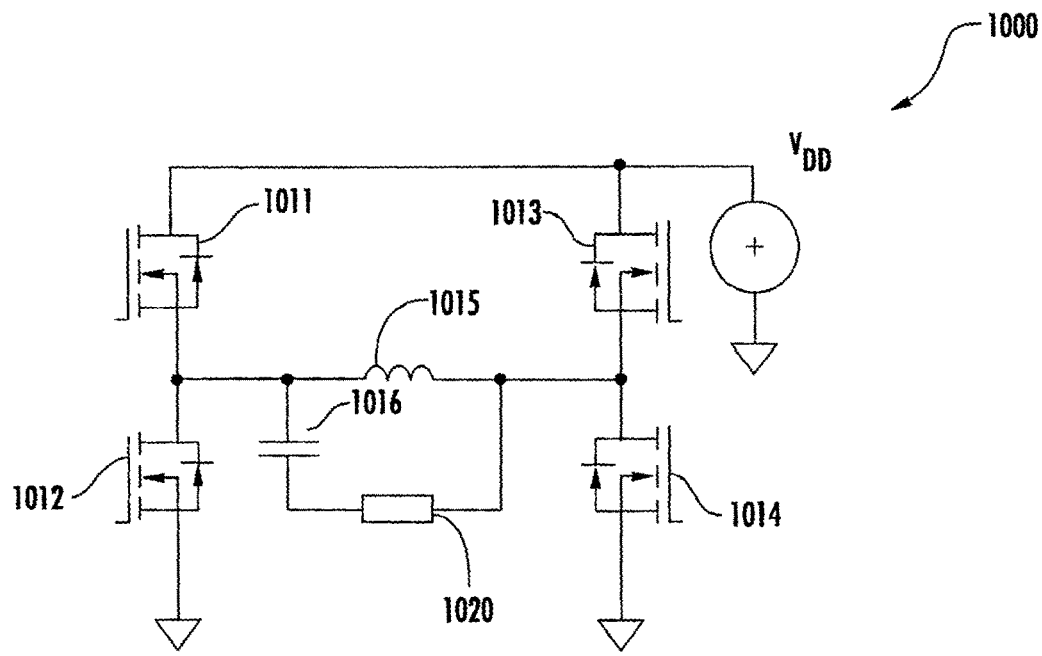
FIG. 10 illustrates a VMCD amplifier in accordance with another embodiment of the present invention.

FIG. 10 illustrates a VMCD amplifier 1000 in accordance with another embodiment of the present invention. As discussed above, VMCD amplifier 300 with transistors 311 and 312 form a half bridge topology. VMCD amplifier 1000 illustrated in FIG. 10 comprises four transistors, preferably GaN FETs, to form a full bridge topology. Although not shown, it should be appreciated that in one embodiment, a control circuit, such as a dead-time control module module, can be coupled to the gates of the transistors to alternatively turn on and turn off the transistors as would be understood to one skilled in the art.

As shown in FIG. 10, VMCD amplifier 1000 includes transistors 1011 and 1012 coupled in series between the voltage source $V_{DD}$ and ground. Two additional transistors 1013 and 1014 are coupled in parallel to transistors 1011 and 1012, also between the voltage source $V_{DD}$ and ground. The four transistor design forms a full bridge configuration for VCMD amplifier 1000. As would be appreciated to one skilled in the art, the full bridge configuration doubles the output power for the voltage source $V_{DD}$ applied to a half bridge configuration, such as the design illustrated in FIG. 3. Preferably, transistors 1011 and 1014 switch together and transistors 1012 and 1013 switch together during operation.

Furthermore, the full bridge configuration eliminates a capacitor from the tank circuit provided in the half bridge topology of VCMD amplifier 300 of FIG. 3. As shown in FIG. 10, inductor 1015 is coupled between switch nodes N1 and N2 in parallel to load 1020. Capacitor 1016 is provided for resonant toning with load 1020. It should also be appreciated that the design shown in FIG. 10 has the load 1020 connected differentially, which also advantageously reduces possible electromagnetic interference.

Figure 11:
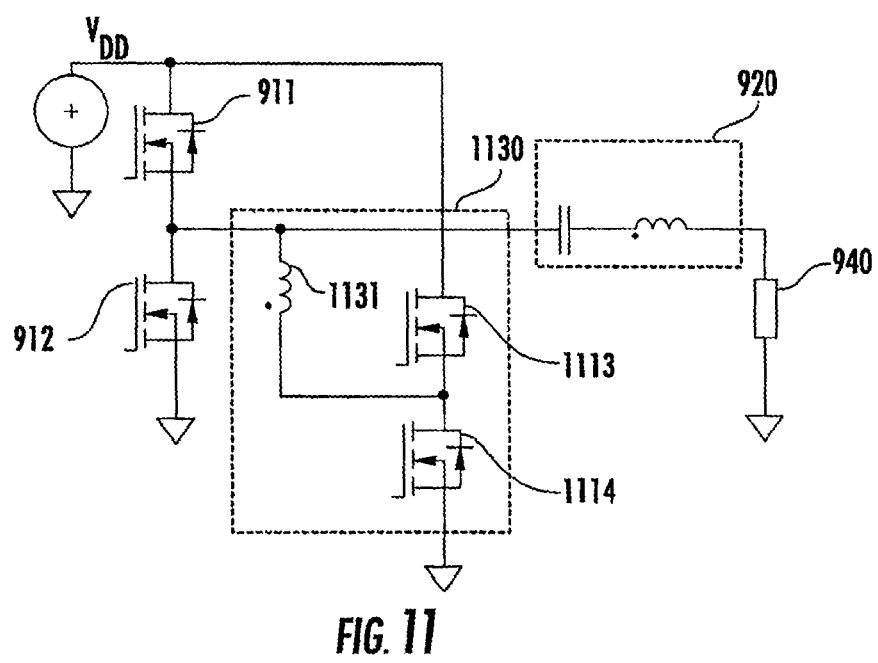
FIG. 11 illustrates another exemplary embodiment of a VMCD amplifier in accordance with the present invention.

Finally, FIG. 11 illustrates yet another exemplary embodiment of a VMCD amplifier in accordance with the present invention. As shown in FIG. 11, the high efficiency VMCD amplifier includes many of the same components as the designs of FIGS. 9A-9C, including transistors 911 and 912 and resonant tuning circuit 920. In this embodiment, the primary tank circuit 1130 includes inductor 1131 and a pair of transistors 1113 and 1114. Collectively, inductor 1131 and transistor 1114 are coupled in series and further coupled between the switch node and ground. Furthermore, transistor 1113 is coupled between the voltage source $V_{DD}$) and a node connecting inductor 1131 and transistor 1114. In this configuration, it should be appreciated that the resonant tuned load 920 is coupled to a half bridge topology that enables two distinct loads to be used, such that tuning between the coils can be slightly shifted facilitating significant power bandwidth due to the load and coupling variation.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A voltage mode class D power amplifier comprising:
  a first pair of N-GaN transistors connected in series between a voltage source and a ground connection, the first pair of N-GaN transistors comprising an upper first pair N-GaN transistor and a lower first pair N-GaN transistor, the upper and lower first pair N-GaN transistors each having a gate, a source and a drain, the drain of the lower first pair N-GaN transistor being connected to the source of the upper first pair N-GaN transistor, and the gates of the upper and lower first pair N-GaN transistors coupled to a control circuit to alternatively turn on and turn off the upper and lower first pair N-GaN transistors;
  a second pair of N-GaN transistors connected in series between a voltage source and a ground connection, the second pair of N-GaN transistors comprising an upper second pair N-GaN transistor and a lower second pair N-GaN transistor, the upper and lower second pair N-GaN transistors each having a gate, a source and a drain, the drain of the lower second pair N-GaN transistor being connected to the source of the upper second pair N-GaN transistor, and the gates of the upper and lower second pair N-GaN transistors coupled to the control circuit to alternatively turn on and turn off the upper and lower second pair N-GaN transistors;
  a first switch node disposed between a source of a first N-GaN transistor of the first pair of transistors and a drain of a second N-GaN transistor of the first pair of N-GaN transistors;
  a second switch node disposed between a source of a first N-GaN transistor of the second pair of transistors and a drain of a second N-GaN transistor of the second pair of N-GaN transistors;
  a tank circuit comprising an inductor connected between the first switch node and the second switch node, and a capacitor forming a series resonant circuit with a load to be driven, the tank circuit enabling the power amplifier to operate as a no-load buck converter with zero voltage switching.

2. A voltage mode class D power amplifier comprising:
  a first pair of transistors connected in series between a voltage source and a ground connection;
  a switch node disposed between a source of a first transistor of the first pair of transistors and a drain of a second transistor of the first pair of transistors;
  a non-resonant tank circuit connected between the switch node and the ground connection or the voltage source or both, the tank circuit including a first inductor with an inductance that absorbs an output capacitance of the pair of transistors, and a second pair of transistors connected in series between a voltage source and a ground connection;
  a first switch node disposed between a source of a first transistor of the first pair of transistors and a drain of a second transistor of the first pair of transistors;
  a second switch node disposed between a source of a first transistor of the second pair of transistors and a drain of a second transistor of the second pair of transistors;

wherein the first inductor is connected between the first switch node and the second switch node; and a resonant tuning circuit comprising a capacitor and a second inductor connected to a load in series and coupled to either the first or the second switch node;

wherein the tank circuit enables the power amplifier to operate as a no load buck converter with zero voltage switching; and wherein the power amplifier is configured to self-commutate the first switch node with a necessary dead-time between gate signals applied to the first pair of transistors.

3. The power amplifier of claim 2, wherein the resonant tuning circuit is coupled in series with the load and between the first switch node and a ground connection.

4. The power amplifier of claim 2, wherein the first inductor and the second pair of transistors form a tank circuit.

5. The power amplifier of claim 2, wherein the capacitor and the load are coupled in parallel to the first inductor.

6. The power amplifier of claim 2, wherein the first pair of transistors form a half bridge voltage inverter and the load is coupled to the half bridge voltage inverter.

7. A power amplifier as recited in claim 2, wherein each of the transistors is a GaN transistor.

* * * * *